United States Patent [19]
Nishi

[11] Patent Number: 5,234,528
[45] Date of Patent: Aug. 10, 1993

[54] VERTICAL HEAT-TREATING APPARATUS
[75] Inventor: Hironobu Nishi, Sagamihara, Japan
[73] Assignee: Tokyo Electron Sagami Limited, Kanagawa, Japan
[21] Appl. No.: 765,524
[22] Filed: Sep. 25, 1991
[30] Foreign Application Priority Data
  Sep. 25, 1990 [JP] Japan .................................. 2-254930
  Sep. 25, 1990 [JP] Japan .................................. 2-254931
[51] Int. Cl.$^5$ ............................................ H01L 21/00
[52] U.S. Cl. .................................. 156/345; 118/719; 118/723
[58] Field of Search ................... 156/646, 345, 643; 118/719, 723; 204/298.25, 298.26, 298.27, 298.35

[56] References Cited
U.S. PATENT DOCUMENTS
  4,770,590  9/1988  Hugues et al. .................. 414/786 X
  4,825,808  5/1989  Takahashi et al. .................. 118/719
  5,015,330  5/1991  Okumura et al. ................ 156/657 X

FOREIGN PATENT DOCUMENTS
  63-84016  4/1988  Japan .
  WO/90/109-49  9/1990  PCT Int'l Appl. .................. 118/722

Primary Examiner—Thi Dang
Attorney, Agent, or Firm—Oblon, Spivak, McClelland, Maier & Neustadt

[57] ABSTRACT

A vertical heat-treating apparatus to be used for a thermal diffusion step or film-forming step in the manufacture of a semiconductor device is proposed. This vertical heat-treating apparatus is characterized in that a work piece-waiting mechanism is incorporated in the apparatus for applying a pre-treatment to workpieces such as semiconductor wafers so as to prevent oxidation of the workpiece, or to remove the natural oxide film formed on the surface of the workpiece.

19 Claims, 5 Drawing Sheets

VERTICAL HEAT-TREATING APPARATUS

BACKGROUND OF THE INVENTION

1. Field of the Invention

The present invention relates to a vertical heat-treating apparatus used in the thermal diffusion step or film-forming step in the process of manufacturing a semiconductor device.

2. Description of the Related Art

Researches on a vertical heat-treating apparatus used in the thermal diffusion step or film-forming step in the process of manufacturing a semiconductor device are being made vigorously in recent years in an effort to save the required space and required energy. The vertical heat-treating apparatus is also effective for dealing with the tendency toward enlargement in diameter of the semiconductor wafer and with tendency toward automation of the process for manufacturing a semiconductor device.

The conventional vertical heat-treating apparatus comprises a vertical heat-treating furnace consisting of a cylindrical reaction vessel made of, for example, quartz and a heater, a heat insulating material, etc. arranged about the outer surface of the reaction vessel. A wafer boat made of, for example, quartz and having a number of semiconductor wafers housed therein is loaded into a lower part of the vertical heat-treating furnace and moved upward by a lift mechanism to reach a predetermined position for applying a predetermined heat treatment to the wafers. In general, semiconductor wafers are put in a wafer carrier made of resin for transporting the wafers, making it necessary to transfer the wafers between the wafer boat and the wafer carrier. Thus, the vertical heat-treating apparatus is provided in general with a wafer transfer mechanism positioned between the wafer boat and the wafer carrier.

It is desirable to use a plurality of wafer boats such that, during the heat treatment applied to semiconductor wafers held by a wafer boat within a heat-treating furnace, other wafers are transferred onto another wafer boat and the wafer boat supporting said wafers is put in a waiting position so as to suppress the reduction in the heat-treating efficiency cause by the wafer transfer time between the wafer boat and the wafer carrier. It is also desirable to provide a section in which the wafer boat supporting the wafers is disposed in preparation for the heat treatment of the wafers and to arrange a plurality of vertical heat-treating furnaces in parallel so as to permit a single wafer transfer mechanism to be commonly used for the plural heat-treating furnaces and, thus, to improve the heat-treating efficiency.

As described above, it is desirable to put a wafer boat having semiconductor wafers mounted thereon in a waiting position so as to improve the treating efficiency. It should be noted, however, that an increase in the waiting time of the semiconductor wafer leads to an increase in the formation of a natural oxide film on the wafer surface. Presently, the semiconductor element is made finer and finer with increase in the integration density, with the result that a defective wiring is brought about by the presence of a natural oxide film as thin as only several nanometers. In addition, the natural oxide film is nonuniform in thickness, with the result that the defective wiring is likely to be brought about more easily. Naturally, it is of high importance to eliminate the natural oxide film on a semiconductor wafer.

As described above, it is very important to improve the heat-treating efficiency and to suppress formation of a natural oxide film on a semiconductor wafer. It is also important to eliminate the natural oxide film formed on a wafer before the wafer is subjected to a heat treatment.

What should also be noted is that a heat-treating apparatus used in the manufacture of a semiconductor device is disposed in general in a clean room. Naturally, a clean air is supplied to each equipment included in the heat-treating device in an attempt to prevent dust being attached to the wafer. However, it is impossible to completely prevent the dust attachment because of convection of the air. It follows that an increase in the waiting time of the semiconductor wafer enhances the possibility of the dust attachment to the wafer. Naturally, it is very important to take measures for preventing the dust attachment to the wafer during the waiting time of the wafer.

SUMMARY OF THE INVENTION

An object of the present invention is to provide a vertical heat-treating apparatus comprising a waiting mechanism of the workpiece so as to improve the heat-treating efficiency. The waiting mechanism permits applying a pre-treatment to the workpiece, e.g., a semiconductor wafer, so as to prevent oxidation of the workpiece or to remove the natural oxide film formed in advance on the workpiece. The pre-treatment makes it possible to maintain a high quality of the workpiece after the heat treatment.

According to the present invention, there is provided a vertical heat-treating apparatus, comprising:

a vertical heat-treating furnace for applying a predetermined heat treatment to a workpiece housed therein;

a workpiece stocker provided with a vessel capable of surrounding an untreated workpiece and serving to temporarily store the workpiece;

gas inlet means communicating with the inner space of said surrounding vessel; and a transport mechanism for transporting the workpiece between the vertical heat-treating furnace and the workpiece stocker.

It is desirable for the vertical heat-treating apparatus of the present invention to comprise further:

a stocker for housing a transporting vessel having the workpiece housed therein; and a transfer mechanism for transferring the workpiece between said transporting vessel and a treating vessel.

The vertical heat-treating apparatus of the present invention comprises a stocker for housing a workpiece in preparation for the heat treatment applied to the workpiece, making it possible to suppress the reduction in the treating efficiency caused by the transfer operation, which takes a long time, of the workpiece between the transporting vessel and the treating vessel. Further, the workpiece stocker is constructed to be capable of applying a pre-treatment to the workpiece, making it possible to suppress the defect occurrence in the workpiece after the heat treatment, said defect occurrence accompanying the increase in the waiting time of the workpiece. It follows that it is possible to further improve the quality of the workpiece after the heat treatment.

Further, a series of devices including the transporting vessel stocker, the transfer mechanism, the workpiece stocker, the transport mechanism and the vertical heat-treating furnace are incorporated in the vertical heat-treating apparatus of the present invention, making it possible to carry out effectively each step of the heat treatment including the transfer of the workpiece and the transport of the vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
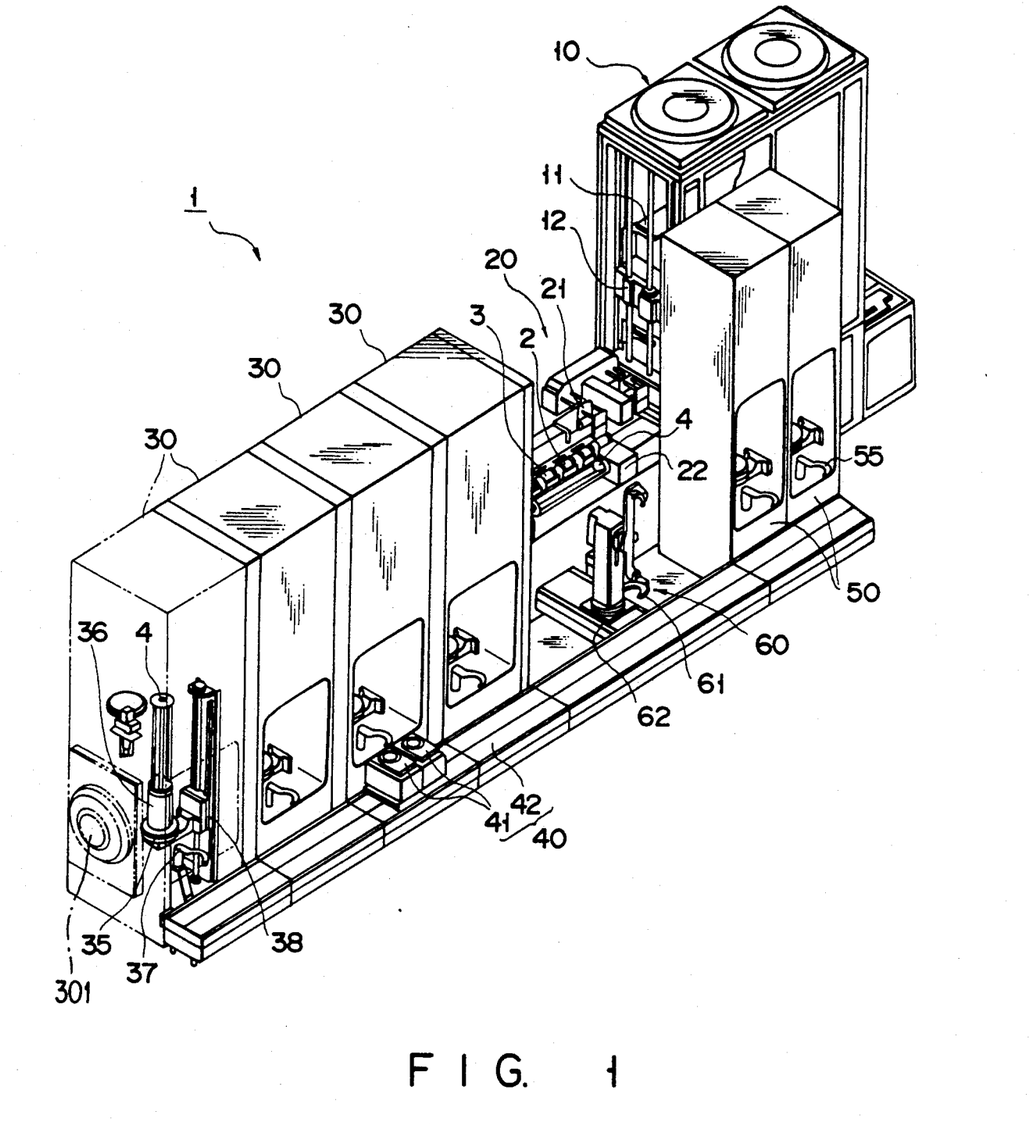
FIG. 1 is an oblique view showing a vertical heat-treating apparatus according to one embodiment of the present invention.
Figure 2:
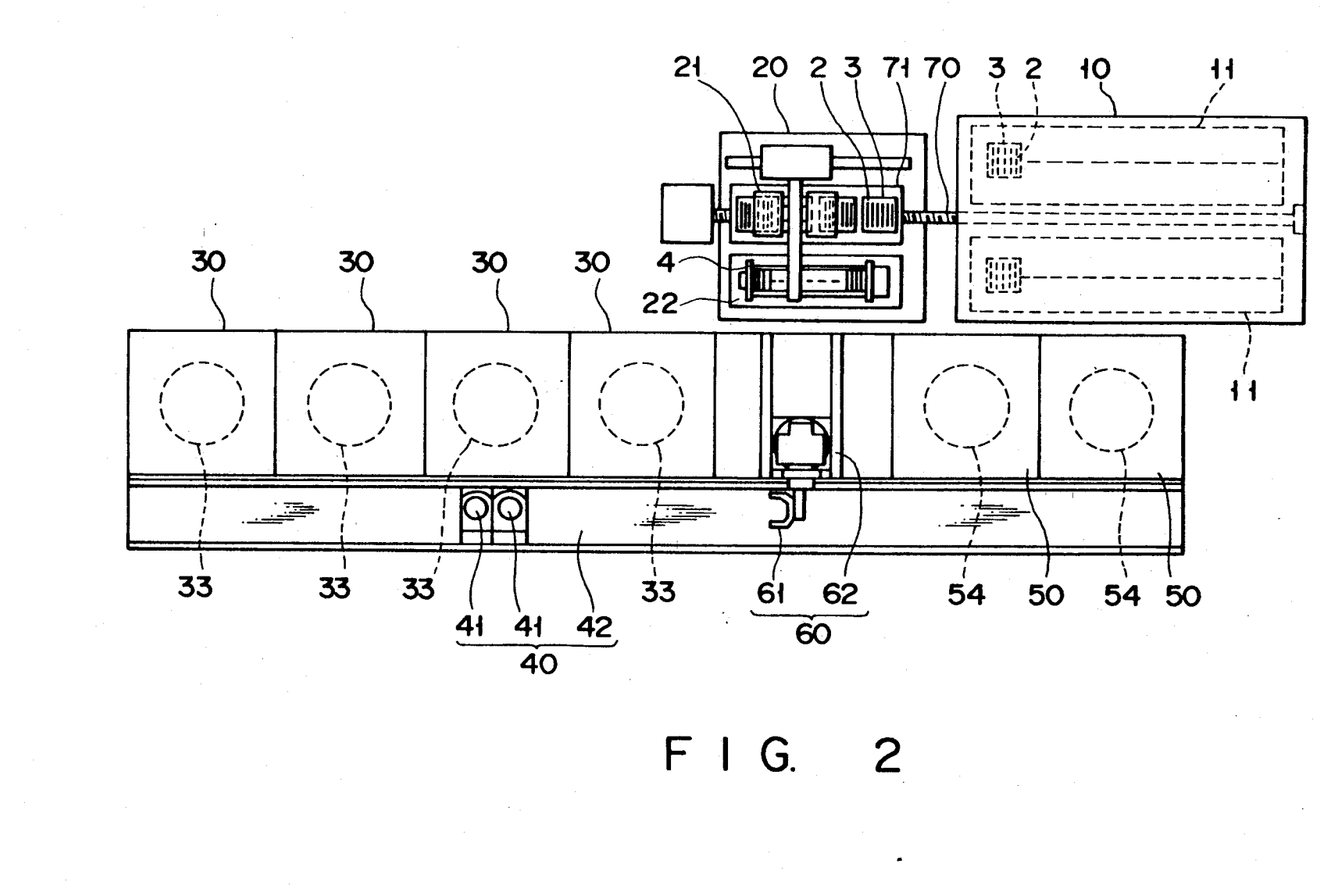
FIG. 2 is a plan view showing the apparatus of FIG. 1.

Let us describe a vertical heat-treating apparatus 1 according to one embodiment of the present invention with reference to the accompanying drawings. As shown in FIGS. 1 and 2, the vertical heat-treating apparatus 1 comprises a carrier stocker 10 capable of storing a number of wafer carriers 3 each housing semiconductor wafers 2 which are to be subjected to heat treatment. The wafer 2 housed in the wafer carrier 3 is transferred onto a wafer boat 4 made of, for example, quartz by a transfer mechanism 20. The wafer boat 4 having the wafer 2 mounted thereon is moved into any one of a plurality of vertical heat-treating furnaces 30 arranged in parallel such that a predetermined heat treatment is applied to the wafer 2. A boat transport mechanism 40 is provided in front of the array of the vertical heat-treating furnaces 30 so as to transport the wafer boat 4 standing upright. Further, a boat stocker 50 is disposed along the boat transport mechanism 40. An untreated semiconductor wafer 2 is held in the boat stocker 50. Also, a pre-treatment is applied to the untreated wafer 2 within the boat stocker 50. Still further, the vertical heat-treating apparatus comprises a boat transfer mechanism 60 serving to transfer the wafer boat 4 between the wafer transfer mechanism 20 and the boat transport mechanism 40 while performing a horizontal-to-vertical conversion.

A plurality of carrier racks 11 each having a plurality of wafer carriers 3 disposed thereon are arranged in a vertical direction within the carrier stocker 10. The wafer carrier 3 is transferred between the carrier stocker 10 and the wafer transfer mechanism 20 by a carrier transport mechanism 70. The carrier stocker 10 also comprises a mechanism 12 for holding and transferring the carrier. The mechanism 12, which is movable both in the lateral and vertical directions, serves to transfer the wafer carrier 3 from the carrier rack 11 onto the carrier transport mechanism 70.

The wafer transfer mechanism 20 comprises a wafer handling section 21 serving to collectively hold a plurality of semiconductor wafers 2. The wafers 2 are transferred by the handling section 21 between the wafer boat 4 disposed on a boat support member 22 in the horizontal direction by the boat transfer mechanism 60 and the plural wafer carriers 3 transported toward the wafer transfer mechanism 20 by the carrier transport mechanism 70.

The boat transfer mechanism 60, which comprises a boat handling section 61 serving to hold the upper and lower end portions of the wafer boat 4 and a transfer section 62 of the boat handling section 61, serves to hold the wafer boat 4 in the horizontal position, said wafer boat 4 having the semiconductor wafer mounted thereon by the wafer transfer mechanism 20. Then, the boat transfer mechanism 60 converts the wafer boat 4 from the horizontal position into the vertical position. Further, the wafer boat 4 is transferred by the boat transfer mechanism 60 onto the boat supporting section 41 of the boat transport mechanism 40.

The boat transport mechanism 40 comprises the boat supporting section 41 having the wafer boat 4 supported thereon upright, a rail 42 for transporting the boat supporting section 41 to any one of the boat stocker 50 and the vertical heat-treating furnace 30 on the basis of a treating program, and a driving means (not shown) for driving the boat supporting section 41 along the rail 42, in the lateral direction perpendicular to the rail 42, and in the vertical direction. It is possible to use an optional driving means known to the art.

Figure 3:
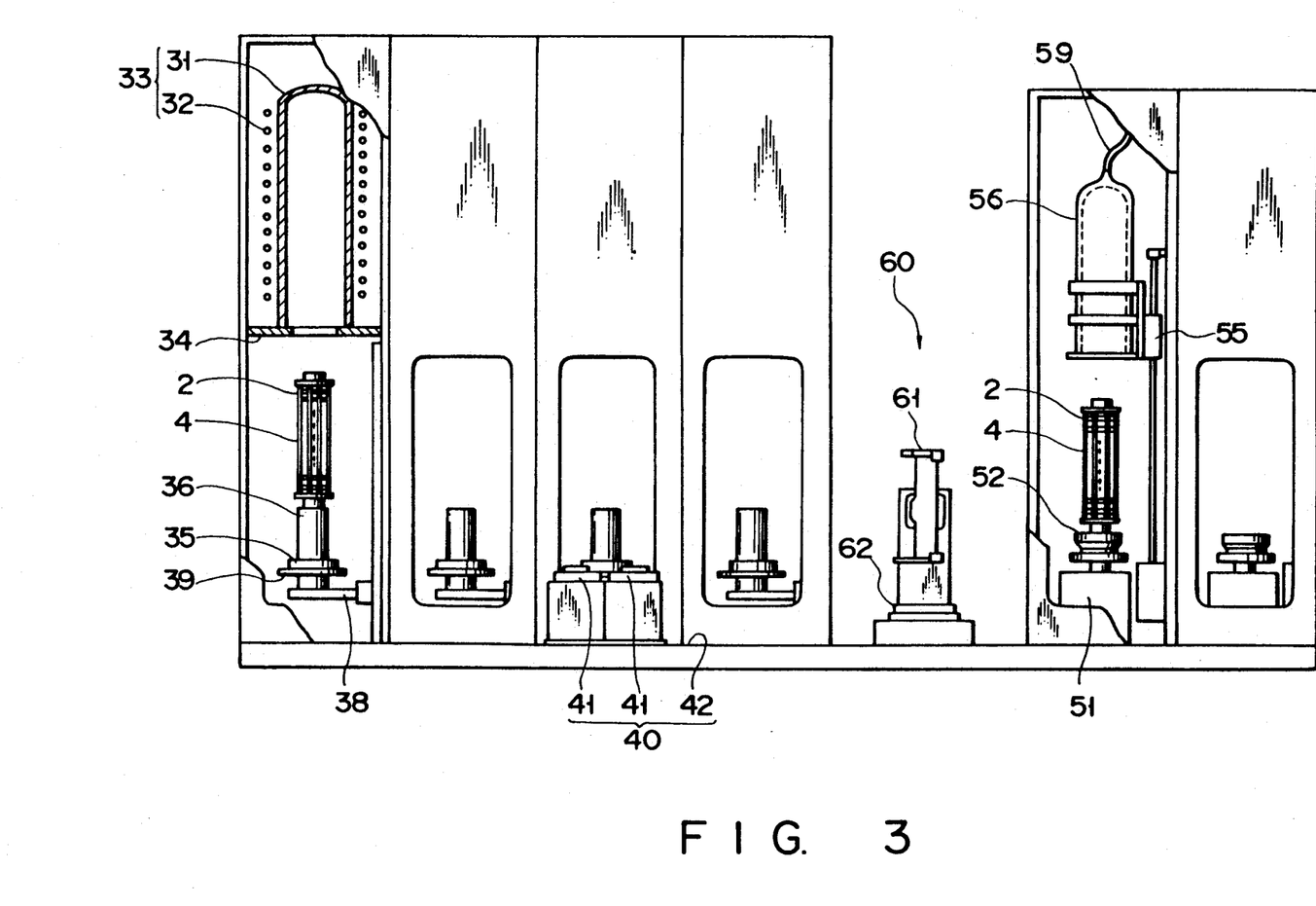
FIG. 3 is a front view, partly broken away, showing in a magnified fashion a gist portion of the vertical heat-treating apparatus shown in FIG. 1.

As shown in FIG. 3, each of the vertical heat-treating furnaces 30 comprises a furnace body 33 consisting of a reaction vessel 31 made of, for example, quartz, a heater 32 arranged to surround the circumferential outer surface of the reaction vessel 31, and a heat insulating member (not shown). The furnace body 33 is fixed to a base plate 34 extending in a direction substantially perpendicular to the axis of the reaction vessel 31.

The wafer boat 4 having the wafers 2 mounted thereon is transferred by a boat transfer arm 37 from the boat transport mechanism 40 onto a region above a heat insulating cylinder 36 disposed on a turntable 35 which is rotatable. Then, the wafer boat 4 is loaded into the reaction vessel 31 by a lift mechanism 38. The open portion of the reaction vessel 31 is hermetically closed by a disk-shaped cap portion 39 which can be moved up and down together with the turntable 35 by the lift mechanism 38.

Figure 5:
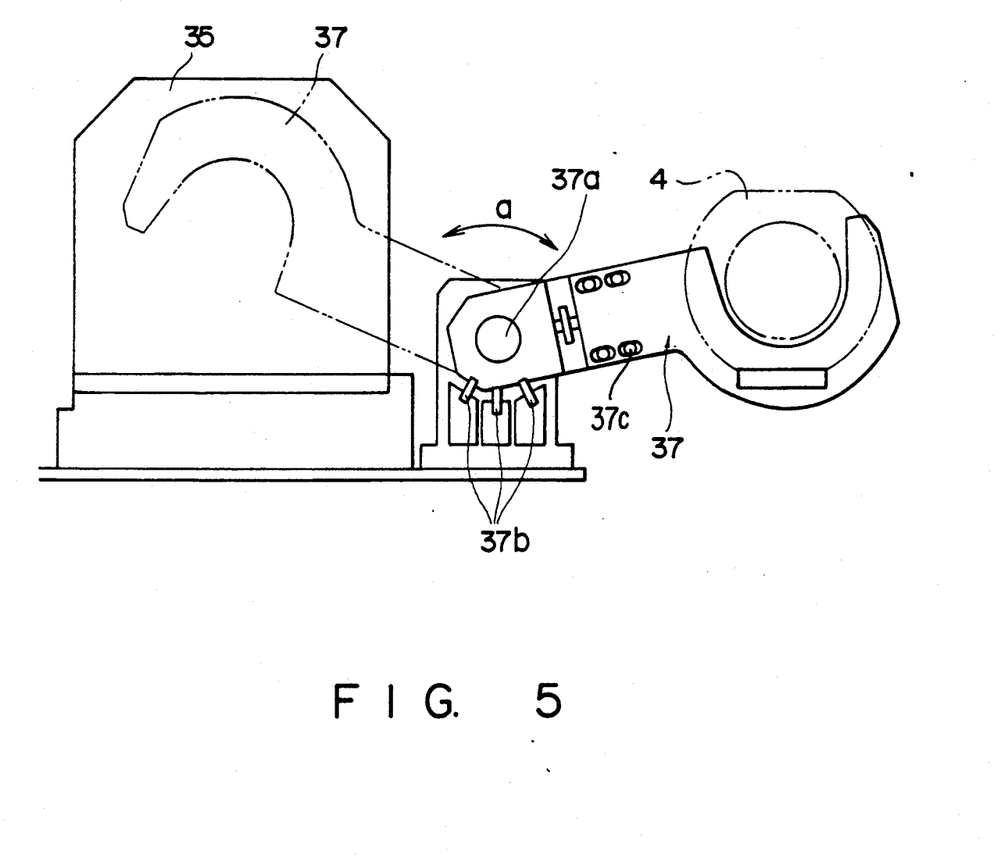
FIG. 5 is a plan view showing in a magnified fashion the transfer arm included in the vertical heat-treating apparatus shown in FIG. 1.

As shown in FIG. 5, the transfer arm 37 is rotatably pivoted to a shaft 37a such that the arm 37 is rotatable in a horizontal direction as denoted by an arrow a and is vertically movable in the longitudinal direction of the shaft 37a. The arm 37 supports the lower end portion of the wafer boat 4 and transfers the wafer boat 4 onto the turntable 35. Reference numeral 37b denotes rotary position sensors, and 37c represents a length adjusting hole. The boat stocker 50, which will be described later, also comprises a boat transfer arm 55 which is substantially equal in construction and function to the transfer arm 37 described above.

A gas inlet device 301 for introducing a clean gas or a nitrogen gas is provided in a side wall of the vertical heat-treating furnace 30.

Two boat stockers 50 are disposed in parallel such that the wafer boat 4 having untreated semiconductor wafers 2 disposed thereon is positioned within one of the two boat stockers in preparation for the succeeding heat treatment so as to suppress the reduction in the treating efficiency caused by the wafer transfer time. Also, pre-treatments such as an anti-oxidizing treatment and an oxide film removing treatment are applied to the wafer 2 during the waiting time so as to improve the quality of the wafer after the heat treatment.

Figure 4:
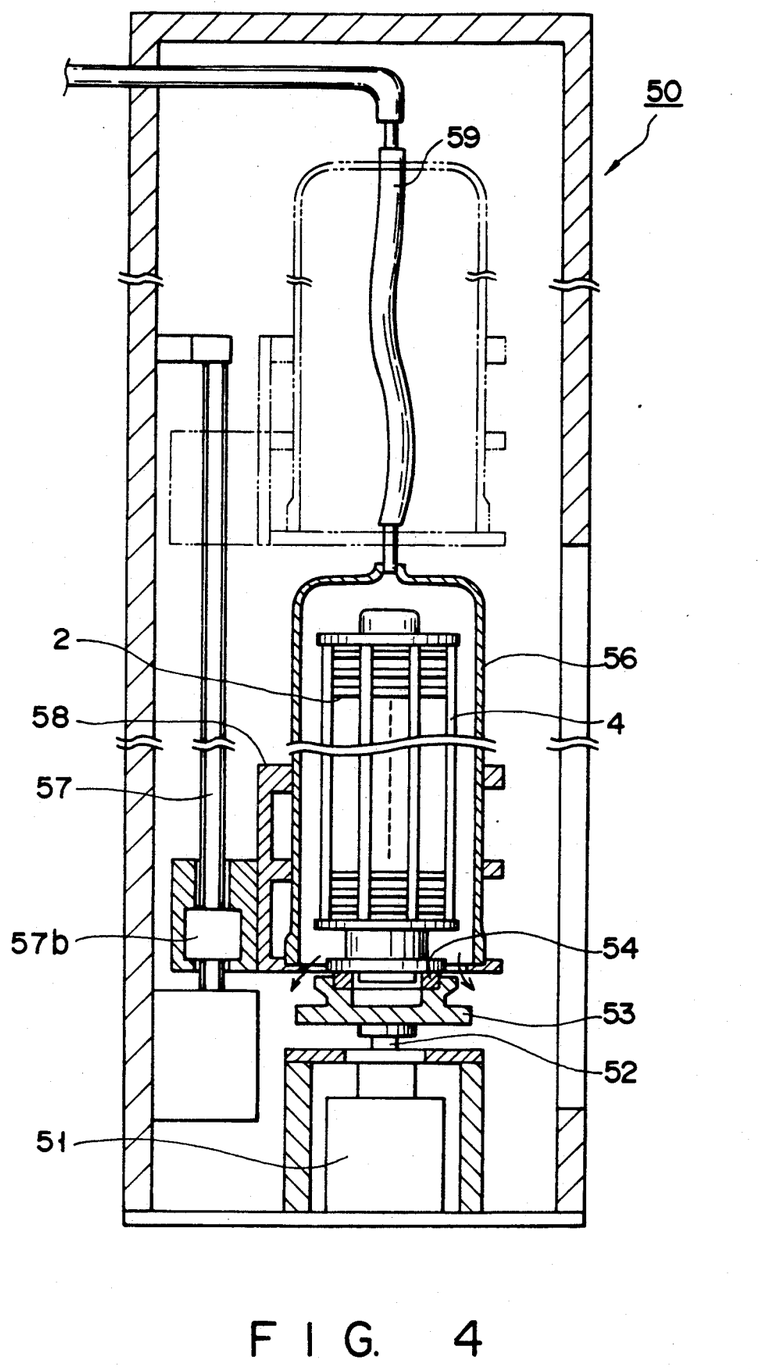
FIG. 4 is a cross sectional view showing in a magnified fashion the workpiece stocker included in the vertical heat-treating apparatus shown in FIG. 1.

As shown in FIG. 4, each boat stocker 50 comprises a turntable 53 fixed to a rotary shaft 52 joined to a rotary driving mechanism 51. A support plate 54 made of, for example, quartz and having the wafer boat 4 supported thereon is disposed on the turntable 53. The boat stocker 50 also comprises a boat transfer arm 55 serving to transfer the wafer boat 4 transported by the boat transport mechanism 40 onto the support plate 54.

A cylindrical surrounding vessel, e.g., a reaction tube 56 made of quartz, is disposed above the turntable 53 at a position at which the reaction tube 56 does not provide an obstacle in the stage of transferring the wafer boat 3. The reaction tube 56 is fixed to a lifting portion 72a of a lift mechanism, e.g., a ball bearing 57, by a frame 58 such that the reaction tube covers the wafer boat 4 disposed on the support plate 54.

A treating gas inlet pipe 59 is connected to the reaction tube 56. A desired pre-treating gas such as a nitrogen gas is supplied through the treating gas inlet pipe 59 into the reaction tube 56 so as to apply a desired pre-treatment to the untreated semiconductor wafer 2. In the case of using, for example, a nitrogen gas as the pre-treating gas, it is possible to prevent a natural oxide film from being formed on the semiconductor wafer 2. It is also possible to prevent dust from being attached to the wafer 2. In the case of using an etching gas, it is possible to remove the natural oxide film formed in the previous step immediately before the wafer is subjected to a heat treatment.

In the embodiment shown in the drawings, four vertical heat-treating furnaces 30 are arranged in parallel so as to make it possible to apply simultaneously a plurality of different heat treatments, e.g., epitaxial growth of silicon and thermal diffusion of an impurity. In order to prevent a cross contamination caused by the different heat treatments which are applied simultaneously, two sets of members are arranged with respect to those portions of the vertical heat-treating device 1 which are in contact with the wafer boat 4, i.e., the boat support portion 41 of the boat transport mechanism 40, the boat holding portion 61 of the boat transfer mechanism 60, the boat support member 22 of the wafer transfer mechanism 20, etc. These two sets of members can be selected appropriately depending on the specific heat treatments applied to the wafers 2.

The apparatus 1 shown in the drawings comprises four vertical heat-treating furnaces 30. However, the number of furnaces 30 need not be restricted to four. It is of course possible for the apparatus 1 to comprise five or more vertical heat-treating furnaces. Also, the number of boat stockers 50 need not be restricted to two. Desirably, the number of boat stockers 50 should be equal to that of vertical heat-treating furnaces.

The vertical heat-treating apparatus 1 of the construction described above is operated as follows. In the first step, the wafer carrier 3 is transferred from the carrier rack 11 of the carrier stocker 10 onto the carrier plate 71 of the carrier transport mechanism 70 and, then, transported toward the wafer transfer mechanism 20. On the other hand, the wafer boat 4 is transferred onto the boat support member 22 by the boat transfer mechanism 60, and the semiconductor wafer 2 housed in the wafer carrier 3 is transferred onto the wafer boat 4. Then, the wafer boat 4 is converted from the horizontal to vertical positions by the boat transfer mechanism 60 and is transferred onto the boat transport mechanism 40. Further, the wafer boat 4 is transported by the boat transport mechanism 40 into any of the boat stocker 50 and the vertical heat-treating furnace 30 on the basis of the processing program.

For example, the wafer boat 4 transported into the vertical heat-treating furnace 30 is disposed on the heat insulating cylinder 36 and, then, loaded by the lift mechanism 38 into the reaction vessel 38 which is preliminarily heated to, for example, about 800° C. After the wafer boat 4 is loaded into the reaction vessel 31, the reaction vessel 31 is closed by the cap portion 39. Then, a treating gas, e.g., $SiH_2Cl_2$, HCl or $H_2$, is introduced through a gas inlet pipe (not shown) into the reaction vessel 31 kept at a predetermined vacuum, e.g., about 10 Torr, so as to apply a heat treatment, e.g., Si epitaxial growth, to the semiconductor wafer 2.

On the other hand, the wafer 2 transported into the boat stocker 50 is disposed on the turntable 52 and covered with the descending reaction tube 54. Under this condition, a pre-treating gas, e.g., nitrogen gas or etching gas, is supplied through the treating gas inlet pipe 56 into the reaction tube 54 so as to apply a desired pre-treatment for preventing oxidation or removing a natural oxide film to the wafer 2 before a desired heat treatment is applied to the wafer 2 within the heat-treating furnace 30.

Transfer of the semiconductor wafer 2 and transport of the wafer boat 4 into the vertical heat-treating furnace 30 or the boat stocker 50 are carried out in succession. Also, the wafer boat 4 transported into the boat stocker 50 is transported into the vertical heat-treating furnace 30 on the basis of the processing program.

After completion of the heat treatment within the vertical heat-treating furnace 30, the semiconductor wafer 2 is transferred together with the wafer boat 4 onto the boat supporting member 22 of the wafer transfer mechanism 20 by the boat transport mechanism 40 and the boat transfer mechanism 60 and, then, onto the wafer carrier 3. The wafer carrier 3 housing the semiconductor wafer 2 after the heat treatment is brought back to the carrier stocker 10 and, then, transported to the next processing step.

As described above, the vertical heat-treating apparatus 1 of the present invention comprises a plurality of boat stockers 50 providing the waiting positions of the wafer boat 4 having the semiconductor wafers 2 mounted thereon. The particular construction permits suppressing the reduction in the treating efficiency accompanying the transfer of the semiconductor wafer 2 regardless of the kind of the heat treatment applied to the wafer 2. The apparatus 1 also comprises the carrier stocker 10 housing the wafer carrier 3 transported from the previous step, the transfer mechanism 20 of the semiconductor wafer 2, and the mechanisms 40 and 60 for transferring and transporting the wafer boat 4. It follows that it is possible to carry out with a high flexibility and consecutively a series of treating steps relating to the heat treatment leading to further improvement in the treating efficiency. Naturally, it is possible to lower the manufacturing cost accompanying the heat treatment of the semiconductor wafer 2.

It should also be noted that the boat stocker 50 is provided with the reaction tube 54 movable in the vertical direction, making it possible to apply a pre-treatment such as a treatment with an inert gas or an etching treatment to the semiconductor wafer 2. Thus, a natural oxide film is prevented from being formed on the wafer 2 in the waiting position. It is also possible to remove a natural oxide film formed previously on the wafer 2. Further, since the wafer 2 is positioned within the reaction tube during the waiting period, it is possible to suppress the defect occurrence caused by, for example, dust attachment to the wafer 2.

To reiterate, the boat stocker 50 included in the vertical heat-treating apparatus of the present invention makes it possible to apply a pre-treatment to the semiconductor wafer 2 mounted on the wafer boat 4. It follows that the defect occurrence during the waiting period can be suppressed, leading to an improvement in the quality of the wafer after the heat treatment and to an improved heat-treating efficiency.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A vertical heat-treating apparatus, comprising:
   a vertical heat-treating furnace for applying a predetermined heat treatment to a plurality of workpieces carried in a heat-treating vessel;
   a workpiece stocker provided with a cylindrical surrounding vessel capable of covering said heat-treating vessel carrying said plurality of workpieces and serving to temporarily store the workpieces inside said cylindrical surrounding vessel;
   gas inlet means communication with an inner space of said cylindrical surrounding vessel for introducing an inert gas or a pretreating gas into said cylindrical surrounding vessel; and
   a transport mechanism for transporting said heat-treating vessel carrying workpieces between said vertical heat-treating furnace and said workpiece stocker for delivering said heat-treating vessel carrying said workpieces to said vertical heat-treating furnace and said workpiece stocker.

2. The vertical heat-treating apparatus according to claim 1, wherein said transport mechanism comprises a linear transport passageway and a heat-treating vessel-supporting section adapted to move along said transport passageway.

3. The vertical heat-treating apparatus according to claim 2, wherein said workpiece stocker is arranged in parallel with the vertical heat-treating furnace, and said transport passageway is linearly arranged in front of the workpiece stocker and the vertical heat-treating furnace.

4. The vertical heat-treating apparatus according to claim 2, wherein said transport mechanism comprises at least two independently movable supporting sections for independently supporting said heat treating vessel.

5. The vertical heat-treating apparatus according to claim 1, wherein said workpiece is a semiconductor wafer, and said heat-treating vessel is a wafer boat.

6. The vertical heat-treating apparatus according to claim 1, further comprising:
   a carrier stocker for housing carriers, each carrying the workpieces therein; and
   a transfer mechanism for transferring the workpieces from said carrier to said heat-treating vessel, and vice versa,
   said carrier stocker being associated with said transport mechanism via said transfer mechanism.

7. The vertical heat treating apparatus according to claim 1, which comprises a plurality of vertical heat-treating furnaces and the same number of workpiece stockers as that of said vertical heat-treating furnaces.

8. The vertical heat-treating apparatus according to claim 1, which comprises at least four vertical heat-treating furnaces.

9. The vertical heat-treating apparatus according to claim 1, wherein said surrounding vessel is open at the lower end, connected at the upper end to said gas inlet means, and supported by a lift mechanism so as to be moved up and down.

10. The vertical heat-treating apparatus according to claim 1, wherein a turntable rotatably supporting said heat-treating vessel is provided within and in a lower part of the workpiece stocker.

11. The vertical heat-treating apparatus according to claim 1, wherein said transport mechanism is so constructed as to transport said heat-treating vessel in an erect state.

12. The vertical heat-treating apparatus according to claim 1, wherein a transfer arm for receiving said heat-treating vessel is provided in each of said vertical heat-treating furnace and said workpiece stocker.

13. A vertical heat-treating apparatus, comprising:
    a vertical heat-treating furnace for applying a predetermined heat treatment to a plurality of workpieces carried in a heat-treating vessel;
    a workpiece stocker provided with a cylindrical surrounding vessel capable of covering said heat-treating vessel carrying said plurality of workpieces and serving to temporarily store the workpieces inside said cylindrical surrounding vessel, said cylindrical surrounding vessel having an open lower end and a gas inlet port at its upper end, so as to allow gas to flow from said upper end to said open lower end;
    gas inlet means communication with the inner space of said cylindrical surrounding vessel for introducing an inert gas or a pretreating gas into said cylindrical surrounding vessel; and
    a transport mechanism for transporting said heat-treating vessel carrying workpieces between said vertical heat-treating furnace and said workpiece stocker for delivering said heat-treating vessel carrying said workpieces to said vertical heat-treating furnace and said workpiece stocker.

14. The vertical heat-treating apparatus according to claim 13, wherein said workpiece stocker is provided with a lifting means for moving said cylindrical surrounding vessel up and down.

15. The vertical heat-treating apparatus according to claim 13, which further comprises:
    a carrier stock for housing carriers, each carrying the workpiece therein; and a transfer mechanism for transferring the workpieces from said carrier to said heat-treating vessel, and vice versa, said carrier stocker being associated with said transport mechanism via said transfer mechanism.

16. The vertical heat-treating apparatus according to claim 13, wherein said transport mechanism comprises a linear transport passageway and a heat-treating vessel-supporting section adapted to move along said transport passageway.

17. A vertical heat-treating apparatus comprising:
a vertical heat-treating furnace for applying a predetermined heat treatment to a plurality of workpieces carried in a heat-treating vessel;
a workpiece stocker provided with a cylindrical surrounding vessel capable of covering said heat-treating vessel carrying said plurality of workpieces and serving to temporarily store the workpieces inside said cylindrical surrounding vessel;
gas inlet means communicating with an inner space of said cylindrical surrounding vessel for introducing an inert gas or a pretreating gas into said cylindrical surrounding vessel; and
a transport mechanism for transporting a heat-treating vessel loaded with said plurality of workpieces in an erect state between said vertical heat-treating furnace and said workpiece stocker for delivering said heat treating vessel to said vertical heat-treating furnace and said workpiece stocker, said transport mechanism comprising a linear transport passageway and a heat treating vessel-supporting section adapted to move along said transport passageway.

18. The vertical heat-treating apparatus according to claim 17, which further comprises:
a carrier stocker for housing carrier, each carrying the workpieces therein; and
a transfer mechanism for transferring the workpieces from said carrier to said heat-treating vessel, and vice versa,
said carrier stocker being associated with said transport mechanism via said transfer mechanism.

19. The vertical heat-treating apparatus according to claim 23, wherein said cylindrical surrounding vessel is open at the lower end, connected at the upper end to said gas inlet means, and supported by a lift mechanism so as to be moved up and down.

* * * * *